(12) United States Patent
Fujisawa

(10) Patent No.: US 8,751,694 B2
(45) Date of Patent: Jun. 10, 2014

(54) DATA TRANSFER OPERATION COMPLETION DETECTION CIRCUIT AND SEMICONDUCTOR MEMORY DEVICE PROVIDED THEREWITH

(71) Applicant: Hiroki Fujisawa, Tokyo (JP)

(72) Inventor: Hiroki Fujisawa, Tokyo (JP)

(*) Notice: Subject to any disclaimer, the term of this patent is extended or adjusted under 35 U.S.C. 154(b) by 0 days.

(21) Appl. No.: 13/800,136

(22) Filed: Mar. 13, 2013

(65) Prior Publication Data

US 2013/0205157 A1    Aug. 8, 2013

Related U.S. Application Data

(63) Continuation of application No. 11/522,424, filed on Sep. 18, 2006.

(30) Foreign Application Priority Data

Sep. 20, 2005 (JP) .................................. 2005-272975

(51) Int. Cl.
*G06F 3/00* (2006.01)

(52) U.S. Cl.
USPC ............................................................ 710/5

(58) Field of Classification Search
None
See application file for complete search history.

(56) References Cited

U.S. PATENT DOCUMENTS

| | | |
|---|---|---|
| 4,138,732 A | 2/1979 | Suzuki et al. |
| 5,480,236 A | 1/1996 | Kawaoka |
| 5,949,734 A | 9/1999 | Matano |
| 2002/0070761 A1 | 6/2002 | Abbiate et al. |
| 2005/0223151 A1 | 10/2005 | Hirose et al. |

FOREIGN PATENT DOCUMENTS

| | | |
|---|---|---|
| JP | 9-69285 C | 8/1979 |
| JP | 62-137791 U | 8/1987 |
| JP | 5-265701 A | 10/1993 |
| JP | 09-180456 A | 7/1997 |
| JP | 9-288889 A | 11/1997 |
| JP | 2002-189695 A | 7/2002 |
| JP | 2002-334054 A | 11/2002 |

OTHER PUBLICATIONS

Japanese Office Action, w/partial English translation thereof, issued in Japanese Patent Application No. JP 2005-272975 dated Jun. 1, 2010.
United State Office Action issued in U.S. Appl. No. 11/522,424 dated Aug. 2, 2013.

*Primary Examiner* — Kris Rhu

(57) ABSTRACT

A data transfer operation completion detection circuit including a first counter for performing a shifting operation in response to the generation of a read initiation signal, a second counter for performing a shifting operation in response to the generation of a burst completion signal, and an SR latch circuit for generating a read enable signal in response to the burst completion signal being generated when the count value of the first counter matches the count value of the second counter. The completion of a read operation or another data transfer operation is thus detected based on a read initiation signal reception history; therefore, it is possible to detect whether all read operations are complete at a given time even if a new read command is received while a read operation or the like is in progress.

19 Claims, 8 Drawing Sheets

DATA TRANSFER OPERATION COMPLETION DETECTION CIRCUIT AND SEMICONDUCTOR MEMORY DEVICE PROVIDED THEREWITH

CROSS-REFERENCE TO RELATED APPLICATIONS

This application is a continuation of U.S. application Ser. No. 11/522,424, filed Sep. 18, 2006, which claims priority under 35 U.S.C. §119 on Japanese Patent Application No. 2005-272975, filed on Sept. 20, 2005, the entire contents of which are incorporated herein by reference.

TECHNICAL FIELD

The present invention relates to a data transfer operation completion detection circuit for detecting the completion of a read operation, write operation, or another data transfer operation, and specifically relates to a data transfer operation completion detection circuit suitable for use in a synchronous semiconductor memory device. In addition, the present invention relates to a semiconductor memory device comprising such a data transfer operation completion detection circuit.

BACKGROUND OF THE INVENTION

Synchronous semiconductor memory devices such as synchronous DRAM (Dynamic Random Access Memory) are widely employed in the main memory of personal computers and the like. Synchronous semiconductor memory devices are a type of memory wherein data is input and output synchronously with a clock signal that is provided from a controller. The clock frequency has increased with each successive year in order to meet demands over the past several years for higher speeds.

Meanwhile, a dramatic increase has occurred especially in the demand for lower power consumption in mobile device applications and the like. However, as the clock frequency increases, the power consumption also increases. Therefore, various designs have been presented in recent synchronous DRAMs to simultaneously achieve high speed and low power consumption.

One technique for achieving lower power consumption is an operation mode called "power-down mode." Power-down mode is a technique wherein the input buffer is stopped to disable the command input from a controller, thereby reducing the power consumed during the period when the DRAM is not accessed. See Japanese Patent Application Laid Open No. H9-69285.

Power-down mode is usually initiated by changing the clock enable signal CKE from a high level to a low level after a data transfer operation sequence is complete; e.g., after a read operation sequence is performed in response to a read command. However, a specification called "early power-down" has been proposed over the past several years, wherein the clock enable signal CKE is changed from a high level to a low level before the read operation, write operation, or other operation sequence is complete. A semiconductor memory device capable of receiving early power-down will automatically enter power-down mode after a read operation, write operation, or other operation sequence is completed once the clock enable signal CKE is changed to a low level while the read operation or write operation is executed by the DRAM core.

In a semiconductor memory device capable of receiving early power-down, accordingly, the clock enable signal CKE is changed to a low level while a read operation or write operation is being executed by the DRAM core. For this reason, a read enable signal or write enable signal must be generated within the DRAM, thereby allowing the read operation or write operation to continue so that the DRAM core operation does not stop midway through. When the read operation or write operation is completed, the read enable signal or write enable signal is deactivated, and, in response, entry into power-down mode will commence.

However, most synchronous DRAMs are capable of receiving a new read command or write command while a read operation or write operation is being performed. In such cases, the operation sequence corresponding to the first received read command or write command is completed, and the subsequently received operation corresponding to the read command or write command is then initiated. For this reason, a detection circuit for detecting whether all read operations or write operations have been completed at a given time is necessary in order to enable such synchronous DRAMs to receive early power-down.

This problem arises not only with synchronous DRAM, but also in CPUs with on-board cache memory and other devices wherein it is necessary to detect the completion of read operations, write operations, and other data transfer operations.

SUMMARY OF THE INVENTION

The present invention was devised to resolve such problems. Therefore, it is an object of the invention to provide a data transfer operation completion detection circuit that can be used in semiconductor devices that are capable of receiving read commands, write commands and other new data transfer commands while a data transfer operation is in progress, and that can detect the completion of a data transfer operation.

Another object of the present invention is to provide a semiconductor device comprising such a data transfer operation completion detection circuit.

The above and other objects of the present invention can be accomplished by a data transfer operation completion detection circuit that is used in a semiconductor device that can transfer data in response to a data transfer command and can accept a new data transfer command while a data transfer operation sequence is in progress, comprising: a first means for maintaining a reception history of said data transfer commands; and a second means for generating a completion detection signal indicating a completion of the data transfer operation based on the reception history maintained by said first means.

According to the present invention, the completion of a read operation, write operation, or another data transfer operation is detected based on at least the data transfer command reception history. Therefore, even if a new read command or write command is issued while a read operation or write operation is being performed, it is possible to detect whether all read operations or write operations have been completed at a given time.

In a preferred embodiment of the present invention, the second means generates a completion detection signal when an indication is made that the first means has not received a data transfer command for a prescribed period of time. It is thus possible to detect whether all read operations or write operations have been completed merely by monitoring the data transfer command generation history.

In another preferred embodiment of the present invention, the first means includes at least one counter. The counter memorizes a history of generating a data transfer initiation signal that is generated based on said data transfer command and that shows the initiation of the data transfer operation sequence; and memorizes a history of generating a data transfer completion signal that shows a completion of a data transfer operation sequence. Therefore, even if the maximum clock number required by a data transfer operation sequence is high, it will be possible to minimize an increase in the scale of the circuit proportional thereto, and an operation margin can be ensured even if the clock frequency is high.

In yet another preferred embodiment of the present invention, the first means contains a first counter for performing a shifting operation in response to the generation of a data transfer initiation signal, and a second counter for performing a shifting operation in response to the generation of a data transfer completion signal. The second means generates a completion detection signal in response to the generation of a data transfer completion signal in a state where the count value of the first counter matches the count value of the second counter. According to this arrangement, a completion detection signal can be generated when a data transfer completion signal has been generated in a standby state with one remaining uncompleted data transfer operation. An operation margin can thus be ensured even when the clock frequency is higher.

The semiconductor memory device according to the present invention comprises: a first means for maintaining a reception history of said data transfer commands; a second means for generating a completion detection signal indicating a completion of the data transfer operation based on the reception history maintained by said first means; and a third means for accepting a power-down command, wherein said semiconductor memory device can entry a power-down mode in response to the completion detection signal in a case where the power-down command is issued after the data transfer command is issued and before the data transfer operation sequence is completed.

According to the present invention, it is possible to provide a semiconductor memory device capable of receiving early power-down.

Therefore, according to the present invention, it is possible to detect whether all read operations or write operations have been completed at a given time even when a new read command or write command is received while a read operation or write operation is being executed. Early power-down and other modes can thus be properly executed.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
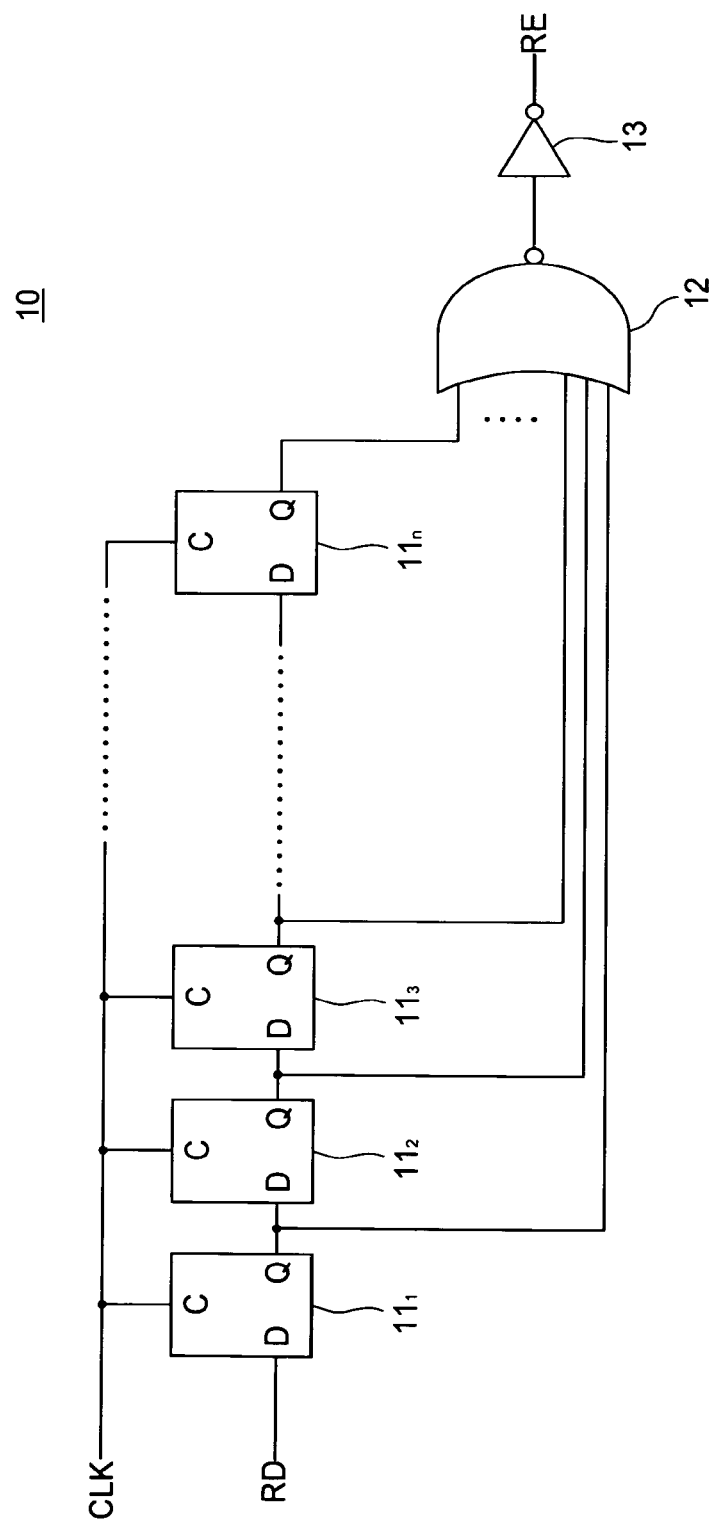
FIG. 1 is a circuit diagram of a data transfer operation completion detection circuit according to the first preferred embodiment of the present invention.

FIG. 1 is a circuit diagram of a data transfer operation completion detection circuit 10 according to the first preferred embodiment of the present invention.

The detection circuit 10 according to the present embodiment is a circuit for a synchronous DRAM, and is used to detect that all read operations are complete. As shown in FIG. 1, the detection circuit 10 according to the present embodiment comprises n cascaded latch circuits $11_1$ through $11_n$, a NOR circuit 12 for receiving the output from the n latch circuits $11_1$ through $11_n$, and an inverter 13 for receiving the output from the NOR circuit 12.

The latch circuits $11_1$ through $11_n$ are each so-called D-type latch circuits comprising an input end D, an output end Q, and a clock end C. The signal supplied to the input end D is latched in response to the changing of the signal (internal clock CLK) provided to the clock end C from a low level to a high level, and then output by the output end Q. A read initiation signal RD generated within the synchronous DRAM based on a read command is supplied to the input end D of the first latch circuit $11_1$, and is successively shifted to the subsequent latch circuits $11_2$ through $11_n$. In the present embodiment, the read initiate signal RD is high active.

The number n of latch circuits $11_1$ through $11_n$ is set to be equal to the maximum number of clocks (maximum cycle) required by the read operation sequence. The maximum cycle is decided by the addition latency (AL), which is the delay from when a read command is received until the DRAM core initiates a read operation, the CAS latency (CL), which is the delay from the DRAM core initiating the read operation until the first data is output, and the burst length (BL), which is the amount of data continuously outputted in the read operation sequence.

Specifically, when using double data-rate (DDR) synchronous DRAM, which inputs and outputs data at both edges of the clock, the maximum cycle n is given by $$n=AL+CL+(BL/2)+1$$

For example, if AL is 10, CL is 11, and BL is 8, then n is 26. This indicates that twenty-six cycles of the clock (26 clocks) are necessary from the read command READ being issued until the final data component is finished being output, and the next operation can be performed.

In the detection circuit 10 of the present embodiment, the number of latch circuits $11_1$ through $11_n$ is set to be equal to the maximum number of cycles n. Therefore, a read initiate signal RD must be present in any of the latch circuits $11_1$ through $11_n$ while the read operation sequence is in progress. For this reason, during the read operation sequence, any of the input from the NOR circuit 12 will be at a high level, and the read enable signal RE, which is the output of the inverter 13, will thus sustain a high level.

Figure 2:
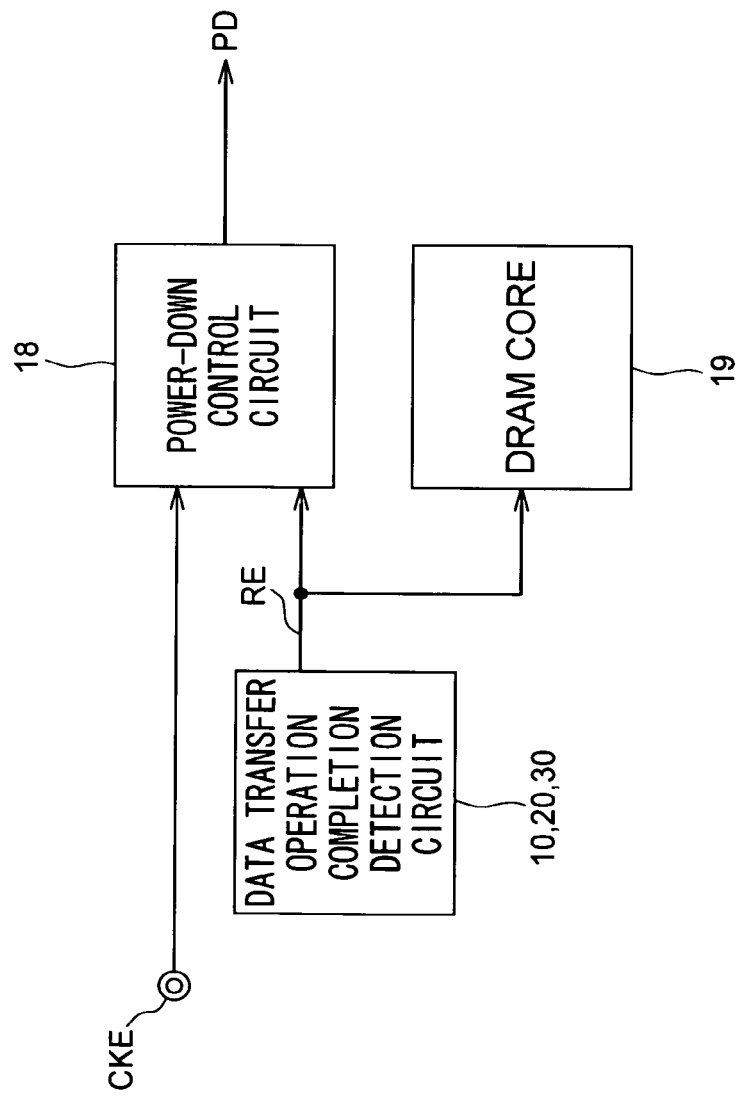
FIG. 2 is a block diagram of a semiconductor device that employs the data transfer operation completion detection circuit shown in FIG. 1.

As shown in FIG. 2, the read enable signal RE generated by the detection circuit 10 is supplied to the power-down control circuit 18 employed in the synchronous DRAM.

The power-down control circuit 18 is a circuit for generating a power-down signal PD. The synchronous DRAM enters power-down mode when the power-down signal PD is generated. The power-down control circuit 18 does not immediately generate the power-down signal PD when the clock enable signal CKE is changed from a high level to a low level after a read command is received and before the read operation sequence is complete; i.e., the read enable signal RE is sustained at a high level, but pauses for the read enable signal RE to change to a low level and then generates the power-down signal PD. In other words, early power-down can be received by the function of the data transfer operation completion circuit 10 and the power-down control circuit 18.

The read enable signal RE is also supplied to the DRAM core 19. If the read enable signal RE is sustained at a high level, then even if the clock enable signal CKE changes from a high level to a low level, the operation of the DRAM core 19 will not stop, and the read operation will continue.

Figure 3:
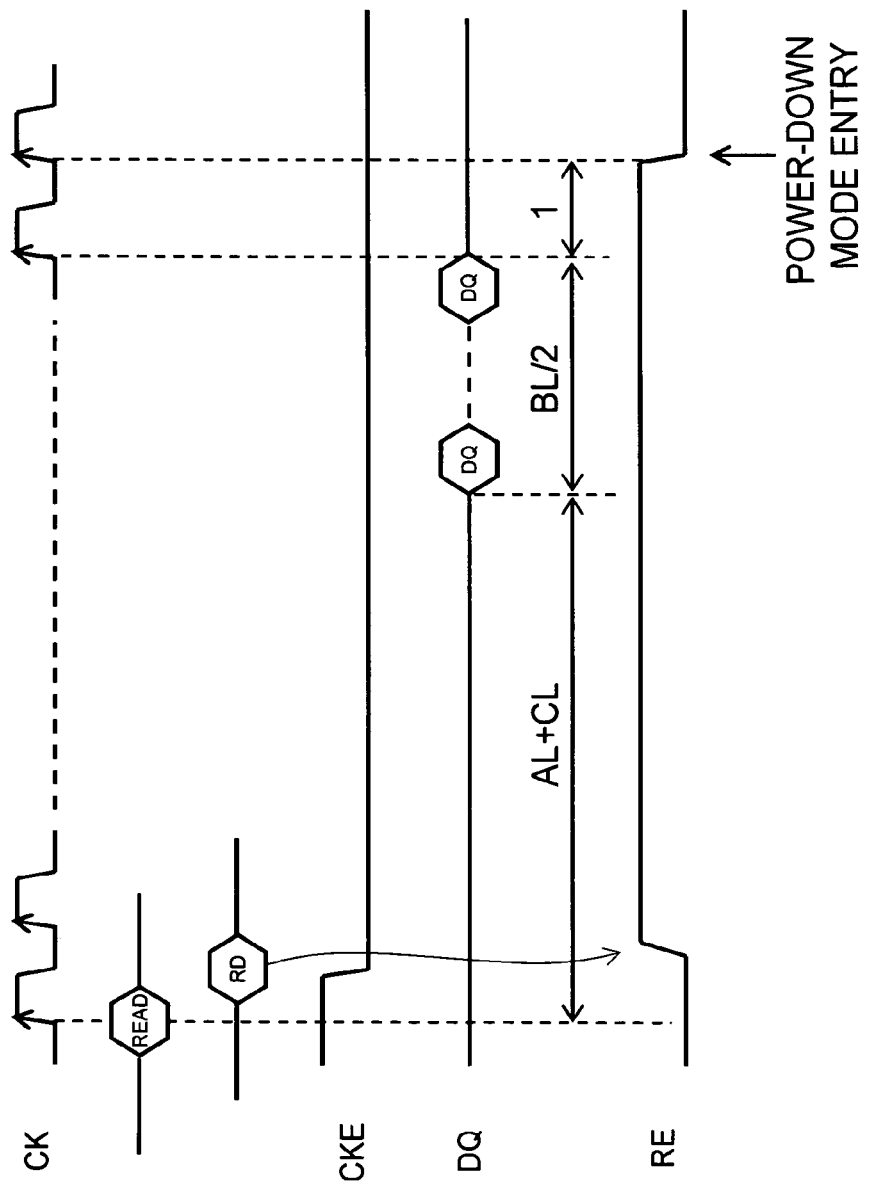
FIGS. 3 and 4 are timing diagrams showing the operation of the data transfer operation completion detection circuit shown in FIG. 1.

FIG. 3 is a timing diagram showing the operation of the detection circuit 10 according to the present embodiment.

As shown in FIG. 3, when a read command READ is issued synchronously with the predetermined active edge of an external clock CK, a read initiation signal RD is generated based n the read command READ. The read initiation signal RD is latched to the latch circuit $11_1$, thereby changing the read enable signal RE to a high level. As described above, the read initiation signal RD is successively shifted to the latch circuits $11_2$ through $11_n$ synchronized with the internal clock CLK. However, the output of these latch circuits $11_1$ through $11_n$ is all fed to the NOR circuit 12, and the read enable signal RE is therefore sustained during this time.

Therefore, the read enable signal RE is sustained at a high level even if a power-down, wherein the clock enable signal CKE is changed from a high level to a low level, is received while a read operation sequence is in progress. The operation of the DRAM core thus does not stop, and the read operation continues as normal.

When a period of time equal to the sum of the AL and CL has passed since the read command READ was issued, the first data is output, and an amount of data equal to the BL is continuously output. With DDR-specification synchronous DRAM, data is output synchronously with both the rising edge and the falling edge of the clock, and the period during which data is actually being output is therefore BL/2, as shown in FIG. 3.

When the final data is finished being output and one further clock has passed, the read initiation signal RD that was shifted through the latch circuits $11_1$ through $11_n$ disappears, and the read enable signal RE is therefore changed to a low level. The change of the read enable signal RE to a low level indicates the completion of the read operation, and, in response, the power-down control circuit 18 shown in FIG. 2 generates a power-down signal PD. The synchronous DRAM thereby enters the power-down mode. Accordingly, in the present embodiment, the change in the read enable signal RE is used as a completion detection signal.

Figure 4:
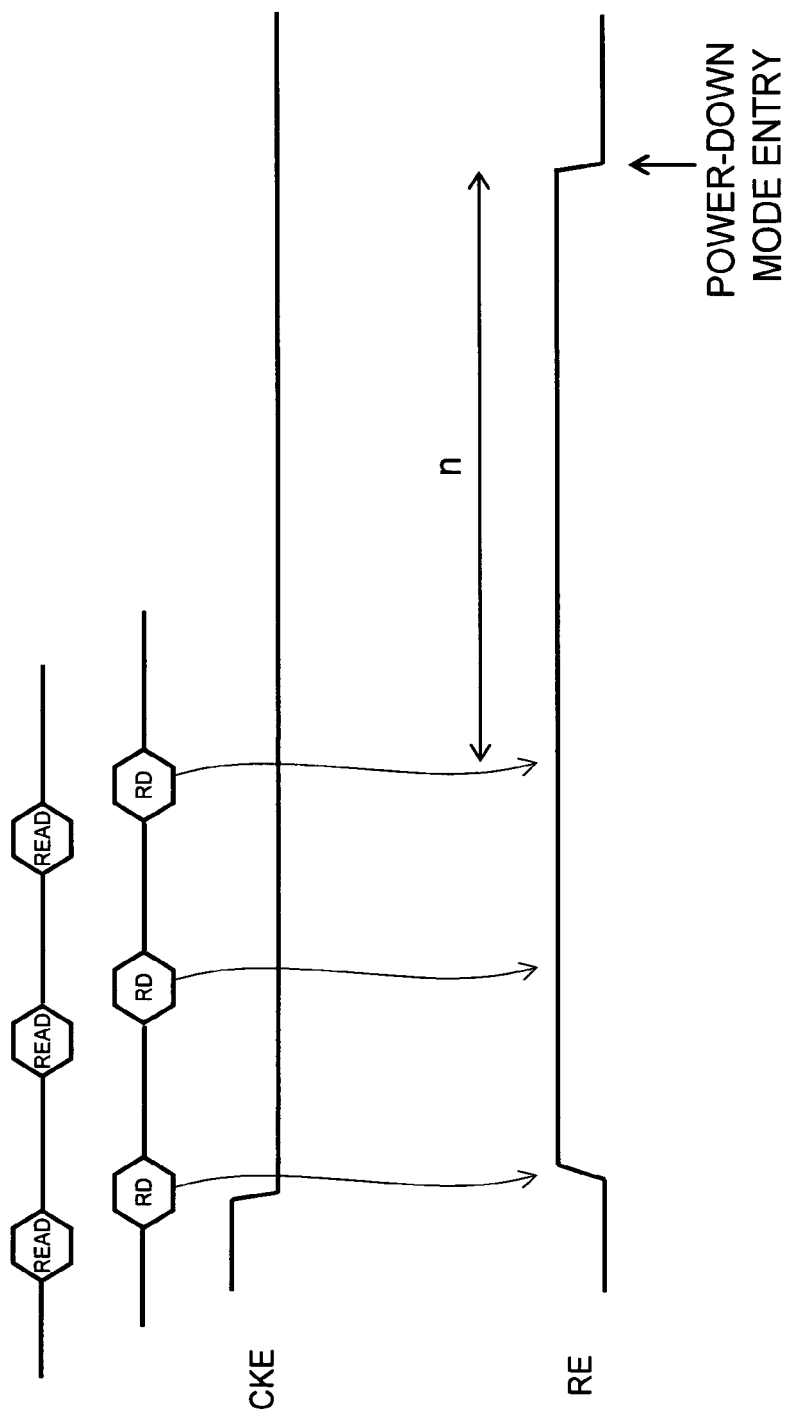

As shown in FIG. 4, when a new read command READ is issued while a read operation sequence is in progress, the new read operation is initiated in parallel to the read operation that is currently in progress. In this case, the latch circuits $11_1$ through $11_n$ perform a shifting operation in the presence of both the prior read initiation signal RD and the new read initiation signal RD, and the read enable signal RE therefore continues to maintain a high level even after a maximum cycle n has passed since the first read-initiation signal RD was activated.

When the maximum cycle n has passed since the final read command READ was issued, the read enable signal RE changes to a low level, and entry into power-down mode commences in response thereto.

The data transfer operation completion detection circuit 10 according to the present embodiment maintains a read command READ reception history in this manner by cascading latch circuits $11_1$ through $11_n$ of the same number as the maximum cycle n. The read enable signal RE can be deactivated in response to the continuation of a state wherein a read command READ is not issued over a period of time that exceeds the maximum cycle n. The point at which all read operations are complete can thereby be accurately detected, even when a new read command READ is received while a read operation sequence is in progress. Therefore, early power-down can be accepted, provided such a detection circuit 10 is installed within the synchronous DRAM.

Latch circuits $11_1$ through $11_n$ of the same number as the maximum cycle n are required in the detection circuit 10 according to the above-described embodiment. Therefore, when the maximum cycle n increases, the scale of the circuit increases proportionally. In addition, a multi-input NOR circuit 12 is used; therefore, a risk is presented that the operation margin of the NOR circuit 12 will be insufficient if the clock frequency is extremely high. For these reasons, the detection circuit 10 according to the above-described embodiment is regarded to be a circuit suitable when the maximum cycle n is relatively small and the clock frequency is relatively low. In addition, the completion of all read operations can be detected merely by monitoring the read initiation signal RD generation history, and the detection circuit 10 is therefore suitably used when a burst completion signal or another signal cannot be employed or is difficult to employ.

An embodiment that is suitable when the maximum cycle n is large and the clock frequency is high shall next be described.

Figure 5:
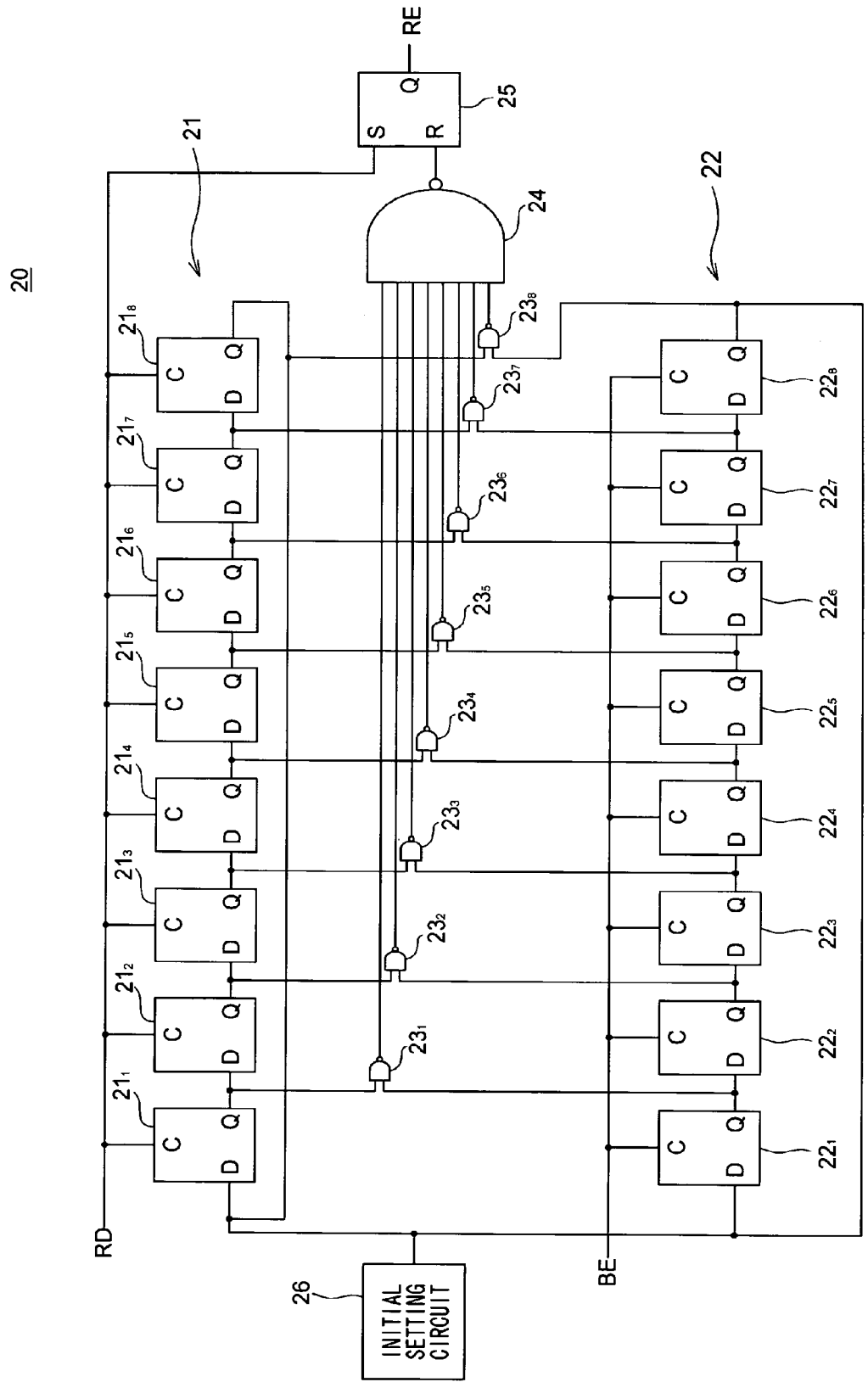
FIG. 5 is a circuit diagram of a data transfer operation completion detection circuit according to a second preferred embodiment of the present invention.

FIG. 5 is a circuit diagram of the data transfer operation completion detection circuit 20 according to a second preferred embodiment of the present invention.

The data transfer operation completion detection circuit 20 according to the present embodiment is a suitable circuit for synchronous DRAM, wherein the maximum cycle n is large and the clock frequency is high, as described above. As shown in FIG. 5, the detection circuit 20 of the present embodiment includes a first counter 21 and a second counter 22. The first counter 21 is constituted of eight circularly connected latch circuits $21_1$ though $21_8$. The second counter 22 is also constituted of eight circularly connected latch circuits $22_1$ through $22_8$.

The latch circuits $21_1$ through $21_8$ and latch circuits $22_1$ through $22_8$ are each so-called D-type latch circuits having an input end D, an output end Q, and a clock end C. The signal provided to the input end D is latched in response to the changing of the signal provided to the clock end C from a low level to a high level, and is then output by the output end Q. A read initiation signal RD generated based on a read command is provided in common to the clock ends C of the eight latch circuits $21_1$ through $21_8$ constituting the first counter 21, and a burst completion signal BE generated when the read process sequence is complete is provided in common to the clock ends C of the eight latch circuits $22_1$ through $22_8$ constituting the second counter 22.

In addition, the detection circuit 20 according to the present embodiment is provided with eight NAND circuits $23_1$ through 23₈. The outputs from the two corresponding latch circuits within the first and second counters 21, 22 are provided to these NAND circuits 23₁ through 23₈. "Two corresponding latch circuits" as mentioned herein refers to the latch circuit 21ᵢ contained in the first counter 21 and the latch circuit 22ᵢ contained in the second counter 22 (i=1 through 8); e.g., a latch circuit 21₁ and latch circuit 22₁.

Furthermore, an eight-input NAND circuit 24 for receiving the outputs of the abovementioned eight NAND circuits 23₁ through 23₈ is provided in the detection circuit 20 of the present embodiment, and the output of the NAND circuit 24 is provided to the reset end R of an SR latch circuit 25. In the SR latch circuit 25, when the signal supplied to the set end S is changed to a high level, the output Q is changed to a high level, and when the signal supplied to the reset end R changes to a high level, the output Q is changed to a low level. A read initiation signal RD is supplied to the set end S of the SR latch circuit 25, as shown in FIG. 5.

In the first counter 21, a high level is latched in only one of the eight latch circuits 21₁ through 21₈, and a low level is latched in the other seven latch circuits. Similarly, in the second counter 22 too, a high level is latched in only one of the eight latch circuits 22₁ through 22₈, and a low level is latched in the other seven latch circuits. In an initial state, a high level is latched to the lead latch circuits 21₁, 22₁ by the operation of an initial setting circuit 26.

The operation of the detection circuit 20 according to the present embodiment shall next be described.

Figure 6:
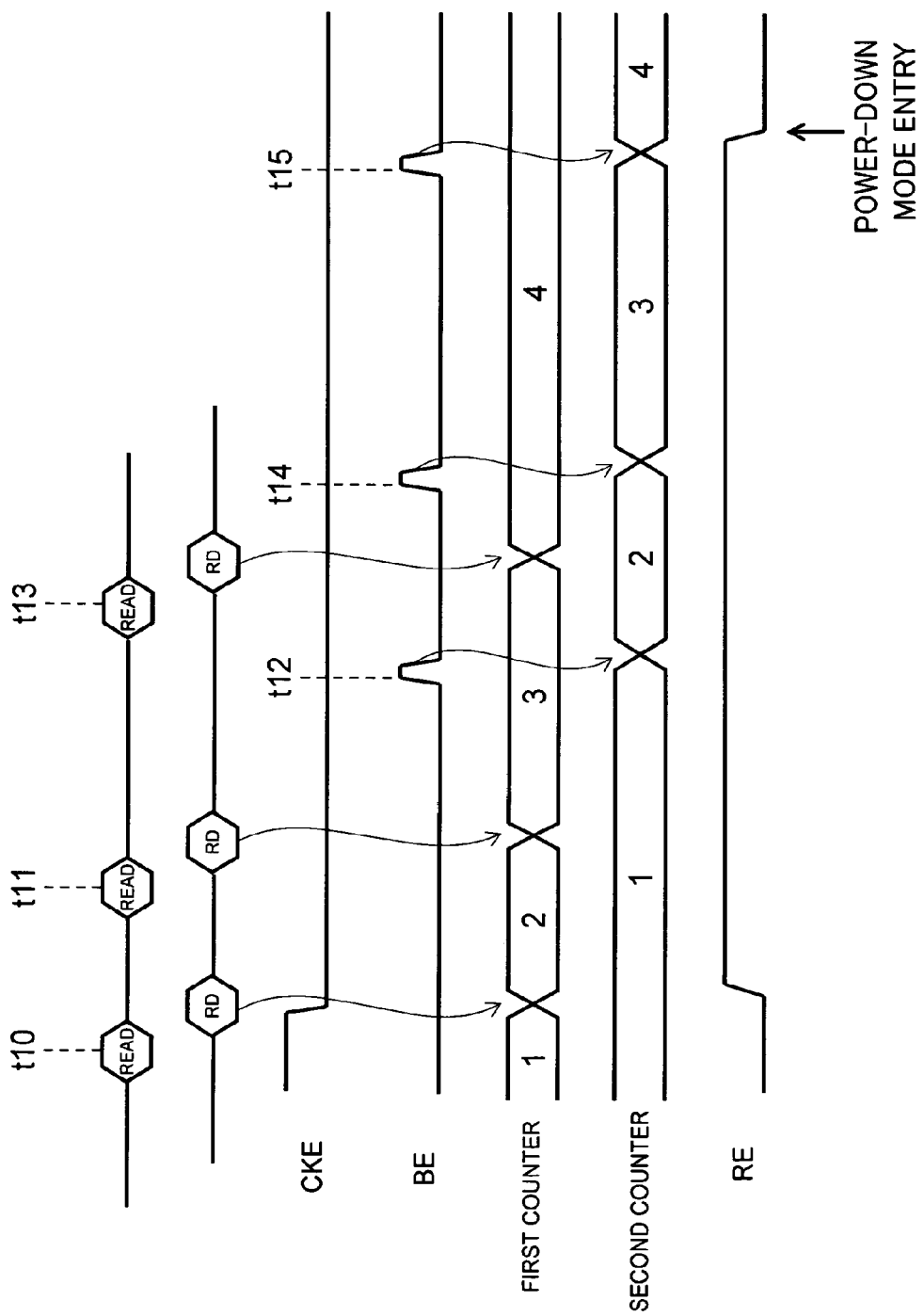
FIG. 6 is a timing diagram showing the operation of the data transfer operation completion detection circuit shown in FIG. 5.

FIG. 6 is a timing diagram for describing the operation of the detection circuit 20 according to the present embodiment.

As shown in FIG. 6, when a read command READ is issued at time t10, a read initiation signal RD is generated based thereon. The SR latch circuit 25 contained in the detection circuit 20 is thereby set, the read enable signal RE changes to a high level, the first counter 21 is incremented, and the count value becomes "2." The term "count value" as used herein refers to the suffix number of the latch circuit to which a high level is latched. Therefore, the initial value of the count value of both the first and second counters is "1." In the above case, as a result of incrementation, the count value of the first counter 21 is "2," and the count value of the second counter 22 is "1." The outputs of the eight NAND circuits 23₁ through 23₈ are accordingly all high level, and a low level is therefore supplied to the reset end R of the SR latch circuit 25.

Accordingly, when the read enable signal RE is high level, the operation of the DRAM core does not stop, and the read operation will continue as normal. This aspect is as described with reference to FIG. 2. When a new read command READ is then issued at time t11 during the execution of a read operation sequence, a new read initiation signal RD is generated based thereon. The first counter 21 is thereby further incremented, and the count value becomes "3." In this case as well, the outputs from the eight NAND circuits 23₁ through 23₈ are all high level, and the read enable signal RE is therefore sustained at a high level.

Once the read operation sequence corresponding to the first read command READ is complete, a burst completion signal BE is then activated at time t12. The second counter 22 is incremented in response, and the count value becomes "2." However, the count value of the first counter 21 is already "3," and the outputs of the eight NAND circuits 23₁ through 23₈ are all high level; therefore, the read enable signal RE is sustained at a high level. The read operation sequence corresponding to the second read command READ thus continues and is executed without entry into power-down mode commencing.

When an additional new read command READ is issued at time t13 while the read operation corresponding to the second read command READ is in progress, a read initiation signal RD is again generated based thereon, and the first counter 21 is further incremented. The count value of the first counter 21 thereby becomes "4."

When a burst completion signal BE is activated at time t14 in response to the completion of the read operation corresponding to the second read command READ, the second counter 22 is incremented, and the count value becomes "3." Furthermore, when a burst completion signal BE is activated at time t15 in response to the completion of the read operation corresponding to the third read command READ, the second counter 22 is further incremented and the count value becomes "4."

The output of the latch circuit 21₄ and the output of the latch circuit 22₄ are thereby at a high level; therefore, the output of the NAND circuit 23₄ is a low level, and a high level is supplied to the reset end R of the SR latch circuit 25. As a result, the read enable signal RE changes to a low level, and, in response, entry into power-down mode commences.

In this way, the detection circuit 20 according to the present embodiment compares the read initiation signal RD generation history indicating the initiation of a read operation sequence and the burst completion signal BE generation history indicating the completion of a read operation sequence, and changes the read enable signal RE to a low level in response to a match between the number of read initiation signals RD generated and the number of burst completion signals BE generated. In other words, the first counter 21 and second counter 22 comprise up-down counters for maintaining a read initiation signal RD generation history and a burst completion signal BE history, and, when the remaining number of incomplete read operations reaches zero, can change the read enable signal RE to a low level.

Thus, in the same manner as in the detection circuit 10 of the first embodiment, the point at which all read operations are complete can be accurately detected even if a new read command READ is issued while a read operation sequence is in progress. Therefore, early power-down can be accepted, provided that such a detection circuit 20 is embedded within the synchronous DRAM.

The detection circuit 20 according to the present embodiment does not require the number of latch circuits to be equal to the maximum cycle n, and can therefore be smaller in scale. It is also possible to reduce the number of inputs to the NAND circuit 24, which is a multi-input gate circuit, and thus the operation margin can be increased. Therefore, the data transfer operation completion detection circuit 20 according to the present embodiment can accurately detect the point at which the read operations are complete, even with a relatively large maximum cycle n and high clock frequency.

The number of latch circuits constituting each of the first and second counters 21, 22 (eight in the above embodiments) must be set to a number that exceeds the value obtained by dividing the number of clocks n (maximum cycle n) required in a read operation sequence by the number of clocks (BL/2 in the case of a DDR-specification) required for data output in a read operation sequence. The reason the number is set to such a level is that when the number of latch circuits is equal to or less than the abovementioned value, and read commands READ are continuously issued, the count value of the first counter 21 will make a full cycle, resulting in the read enable signal RE inevitably changing to a low level regardless of whether all read operations have concluded.

Figure 7:
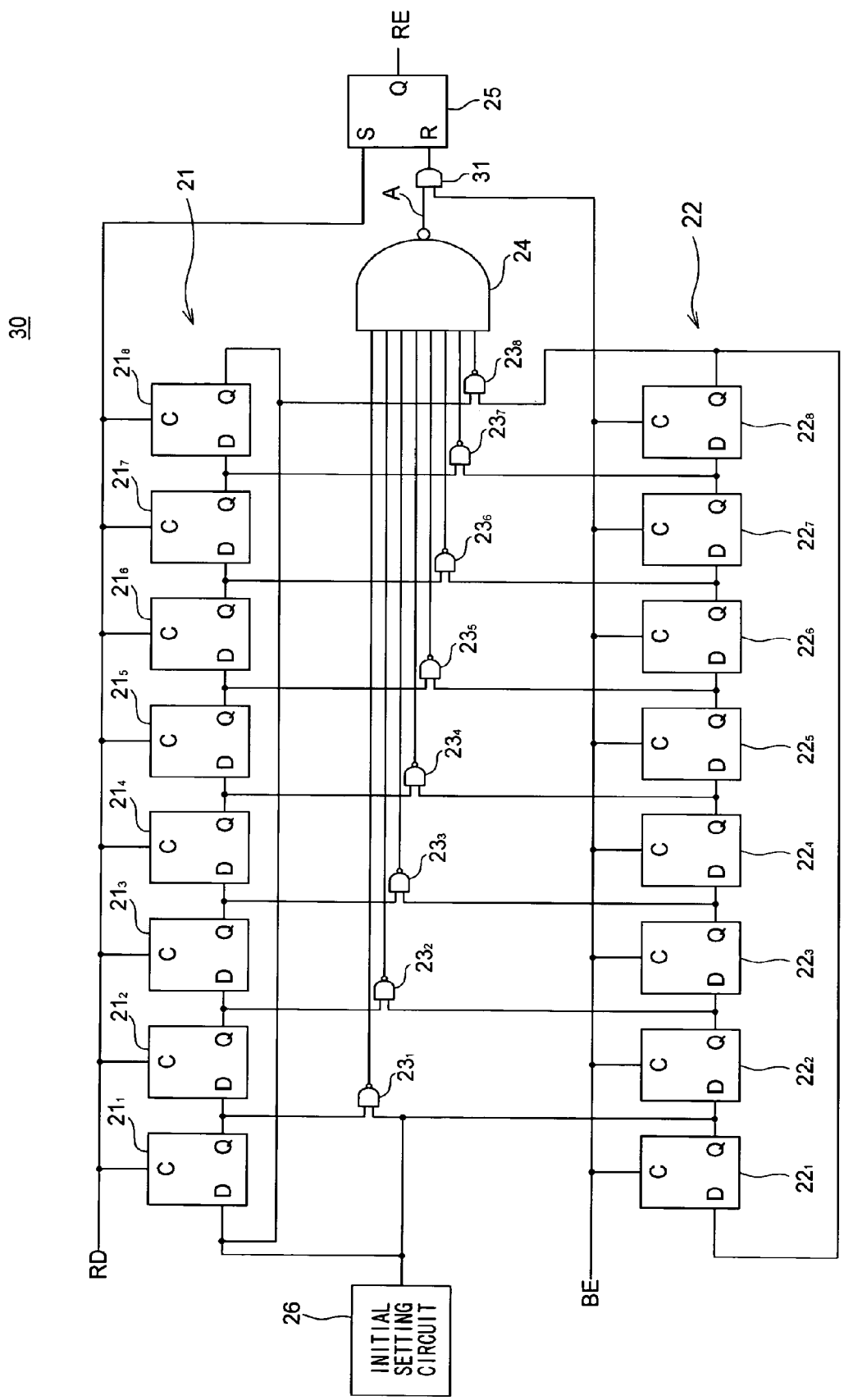
FIG. 7 is a circuit diagram of a data transfer operation completion detection circuit according to a third preferred embodiment of the present invention.

FIG. 7 is a circuit diagram of the data transfer operation completion detection circuit 30 according to a third preferred embodiment of the present invention.

The data transfer operation completion detection circuit 30 according to the present embodiment differs from the detection circuit 20 of the embodiment described above in that an AND circuit 31 is inserted between the eight-input NAND circuit 24 and the SR latch circuit 25, and in that the initial setting circuit 26 latches a high level to the latch circuits $21_1$, $22_2$ in an initial state. The detection circuit 30 according to the present embodiment is otherwise identical to the detection circuit 20 according to the above embodiment. Therefore, the same reference numerals are assigned to the same components, and the description thereof shall not be repeated.

The AND circuit 31 is a two-input AND circuit. The output signal of the eight-input NAND circuit 24 is supplied to one input end of the AND circuit 31, and the burst completion signal BE is supplied to the other input end. The output of the AND circuit 31 is supplied to the reset terminal end R of the SR latch circuit 25. The detection circuit 30 of the present embodiment is thus different from the detection circuit 20 of the above embodiment, with the SR latch circuit 25 not being reset merely by the count values of the first and second counters 21, 22 matching, but being reset in response to the count values of the first and second counters 21, 22 matching and the burst completion signal BE being at a high level.

In the present embodiment, furthermore, the initial setting circuit 26 latches a high level to the latch circuits $21_1$, $22_2$ in an initial state; therefore, the initial value of the first counter is "1," and the initial value of the second counter is "2." The count value of the second counter is accordingly set to be one greater than that of the first counter in an initial state. Thus, in the detection circuit 30 according to the present embodiment, when the first read command READ is issued, and the first read initiation signal RD is generated based thereon, the output of the eight-input NAND circuit 24 immediately changes to a high level (i.e., a state wherein the agreement is detected).

The operation of the detection circuit 30 according to the present embodiment shall next be described.

Figure 8:
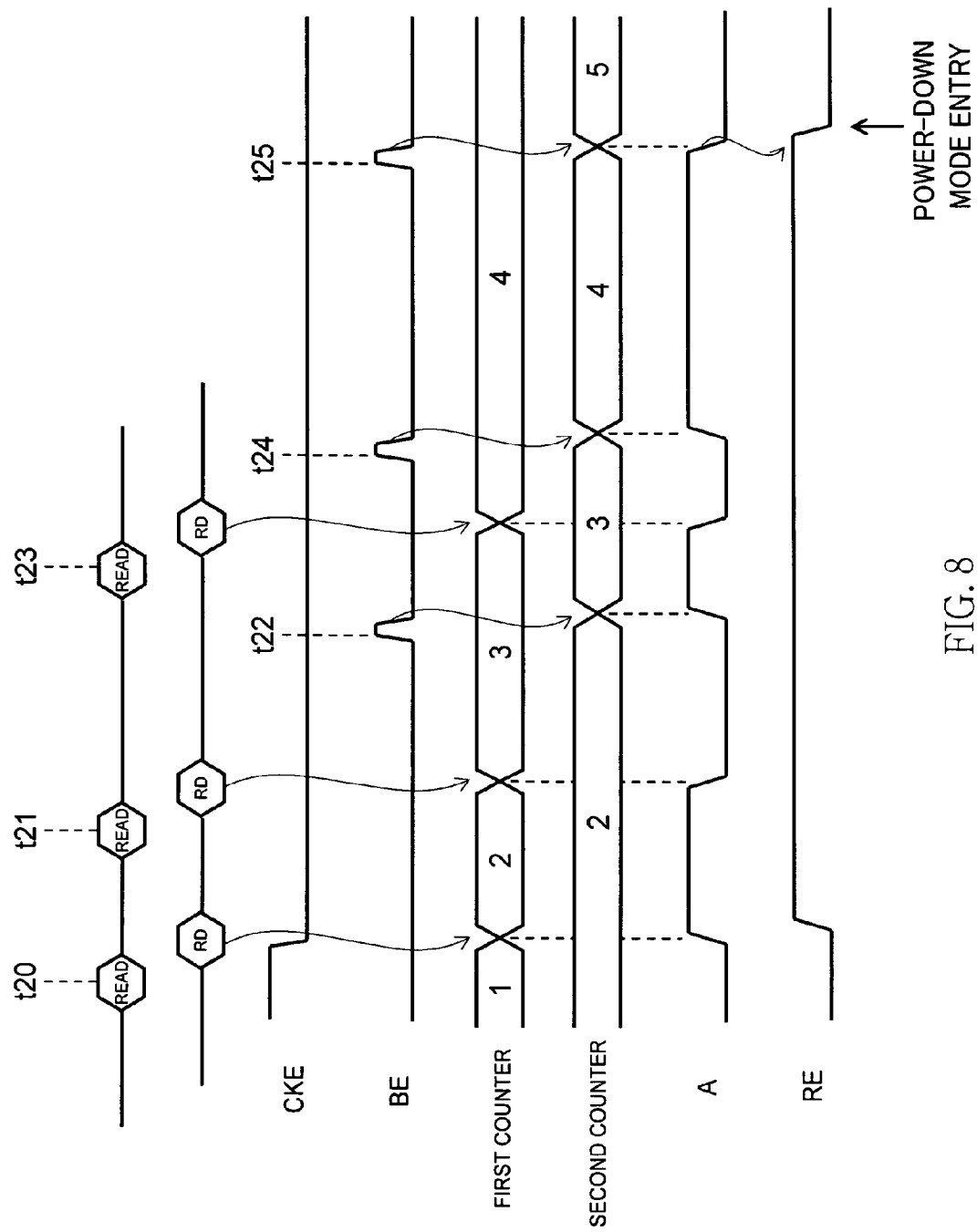
FIG. 8 is a timing diagram showing the operation of the data transfer operation completion detection circuit shown in FIG. 7.

FIG. 8 is a timing diagram for describing the operation of the data transfer operation completion detection circuit 30 according to the present embodiment.

As shown in FIG. 8, when a read command READ is issued at time t20, a read initiation signal RD is generated based thereon. The SR latch circuit 25 contained within the detection circuit 30 is thereby set, the read enable signal RE changes to a high level, the first counter 21 is incremented, and the count value becomes "2." The output A of the eight-input NAND circuit 24 thereby changes to a high level, due to the fact that the count value of the first counter 21 matches the count value of the second counter 22 (i.e., both are "2").

In the present embodiment, an AND circuit 31 is inserted between the eight-input NAND circuit 24 and the SR latch circuit 25. A set state is therefore maintained without the SR latch circuit 25 being reset. In other words, a state in which the output A of the eight-input NAND circuit 24 is at a high level indicates that there is one read command whose operation is not yet complete, and becomes a standby state for resetting the SR latch circuit 25.

When a new read command READ is issued at time t21 while a series of read operations is in progress, a new read initiation signal RD based on this command is generated. The first counter 21 is thereby further incremented, and the count value becomes "3." The count value of the first counter 21 will thus not match the count value of the second counter 22, and, as a result, the output A of the eight-input NAND circuit 24 will change to a low level. In other words, the standby state for resetting the SR latch circuit 25 will be canceled. The canceling of the standby state indicates that two or more read operations that are not complete have accumulated.

Once the read operation sequence corresponding to the first read command READ is complete, a burst completion signal BE is then activated at time t22. In response thereto, the second counter 22 is incremented, and the count value becomes "3." The state then returns to standby, wherein the output A of the eight-input NAND circuit 24 is at a high level.

When a further new read command READ is issued at time t23, during which the read operation corresponding to the second read command READ is in progress, a read initiation signal RD is thus generated based thereon, and the first counter 21 is further incremented. The count value of the first counter 21 thus becomes "4," and the standby state is canceled.

When the burst completion signal BE is activated at time t24 in response to the completion of the read operation corresponding to the second read command READ, the second counter 22 is incremented, the counter value becomes "4," and the state once again returns to standby state.

When a burst completion signal BE is activated at time t25 in response to the completion of the read operation corresponding to the third read command READ, the inputs to the AND circuit 31 change to a high level. A high level is therefore supplied to the reset end R of the SR latch circuit 25. As a result, the read enable signal RE changes to a low level, and, in response thereto, the entry to power-down mode commences. In addition, the second counter 22 is further incremented, the count value becomes "5," and, as with the initial state, a state is resumed wherein the count value of the second counter is one greater than that of the first counter.

In the detection circuit 30 of the present embodiment, the count value of the second counter 22 thus advances one further than the count value of the first counter 21, and the output A of the eight-input NAND 24 is changed to high level during the standby state having a single accumulated read command. Therefore, when the burst completion signal BE is activated in the standby state, the SR latch circuit 25 can immediately be reset without any routing through the relatively large scale eight-input NAND 24. The data transfer operation completion detection circuit 30 according to the present embodiment can thereby exhibit the same effect as the data detection circuit 20 of the above embodiment, and the operation margin of the eight-input NAND 24 can be adequately ensured; therefore, the point at which a read operation is completed can be accurately detected even if the clock frequency is high.

In the present embodiment, the number of latch circuits constituting each of the first and second counters 21, 22 (eight in the above embodiment) must be set to a number that exceeds the value of one added to the value obtained by dividing the number of clocks n (maximum cycle) required in a read operation sequence by the number of clocks (BL/2 in the case of a DDR-specification) required for data output in the read operation sequence. The reason the number is set to such a level is that when the number of latch circuits is equal to or less than the abovementioned value, and read commands READ are continuously received, the count value of the first counter 21 will make a full cycle, inevitably resulting in the state entering standby mode even if the state was not originally in standby mode.

The present invention is in no way limited to the aforementioned embodiments, but rather various modifications are possible within the scope of the invention as recited in the claims, and naturally these modifications are included within the scope of the invention.

For example, in the embodiments described above, an example was described of a circuit for performing an operation in response to a read command. However, the present invention is not limited thereto, and can be used to detect the completion of a write operation in response to a write command. In other words, the present invention can be used to detect the completion of data transfer operations in response to a variety of data transfer commands.

In the embodiments described above, an example was also given of a data transfer operation completion detection circuit for use in synchronous DRAM. However, the scope of use of the present invention is not limited thereto, and the invention can be applied to data transfer operation completion detection circuits for cache memories on CPUs or other devices.

What is claimed is:

1. A device that can perform a data transfer operation in response to each of data transfer commands and can accept a new data transfer command while a data transfer operation responsive to a previous data transfer command is in progress, comprising:
    a plurality of first latch circuits each including a clock terminal, an input terminal and an output terminal, the first latch circuits being connected such that the output terminal of a preceding one of the first latch circuits is connected to the input terminal of a succeeding one of the first latch circuits and the output terminal of an ending one of the first latch circuits is connected to the input terminal of a starting one of the first latch circuits,
    a plurality of second latch circuits each including a clock terminal, an input terminal and an output terminal, the second latch circuits being connected such that the output terminal of a preceding one of the second latch circuits is connected to the input terminal of a succeeding one of the second latch circuits and the output terminal of an ending one of the second latch circuits is connected to the input terminal of a starting one of the second latch circuits,
    a first node supplied with a transfer initiation signal that takes an active level each time the data transfer operation responsive to each data transfer command is initiated, the first node being connected in common to the clock terminals of the first latch circuits,
    a second node supplied with a transfer completion signal that takes an active level each time the data transfer operation responsive to each data transfer command is completed, the second node being connected in common to the clock terminals of the second latch circuits,
    a plurality of first logic circuits each connected to the output terminal of an associated one of the first latch circuits and the output terminal of an associated one of the second latch circuits, each of the first logic circuits being configured to produce a first signal when both of the associated one of the first latch circuits and the associated one of the second latch circuits produce a first logic level at the output terminals thereof and a second signal when at least one of the associated one of the first latch circuits and the associated one of the second latch circuits produces the output terminal thereof a second logic level, and
    a second logic circuit coupled to the first logic circuits, the second logic circuit being configured to produce an active level when at least one of the first logic circuits produces the first signal.

2. The device as claimed in claim 1, further comprising a flip-flop circuit that is brought into one of set and reset states in response to the active level of the transfer initiation signal and into the other of the set and reset states in response to the active level of the second logic circuit.

3. The device as claimed in claim 2, further comprising an initializing circuit that is configured to bring each of the starting one of the first latch circuits and the starting one of the second latch circuits into a different state than each of remaining ones of the first latch circuits and remaining ones of the second latch circuits.

4. The device as claimed in claim 2, wherein each of the first and second logic circuits comprises a NAND gate circuit.

5. The device as claimed in claim 1, further comprising a third logic circuit that is configured to allow an output of the second logic circuit to pass through the third logic circuit each time the transfer completion signal takes the active level.

6. The device as claimed in claim 5, further comprising a flip-flop circuit that is brought into one of set and reset states in response to the active level of the transfer initiation signal and into the other of the set and reset states in response to the output of the second logic circuit, that has passes through the third logic circuit, taking the active level.

7. The device as claimed in claim 6, further comprising an initializing circuit that is configured to bring each of the starting one of the first latch circuits and a second one of the second latch circuits, that is next to the starting one of the second latch circuits, into a different state than each of remaining ones of the first latch circuits and remaining ones of the second latch circuits.

8. The device as claimed in claim 6, wherein each of the first and second logic circuit comprises a NAND gate circuit and the third logic circuit comprises an AND gate circuit.

9. The device as claimed in claim 1, wherein the device accepts a power-down command and further comprises a power-down control circuit that responds to the power-down command and the active level of the second logic circuit to cause the device to enter into a power-down mode.

10. The device as claimed in claim 1, wherein the device is configured as a synchronous DRAM in which each of the data transfer commands is one of a data read command and a data write command, the data transfer operation responsive to the data read command comprising reading out data from an inside of the synchronous DRAM to an outside of the synchronous DRAM, the data transfer operation responsive to the data write command comprising writing data into the inside of the synchronous DRAM from the outside of the synchronous DRAM, and the transfer completion signal comprising a burst end signal.

11. The device as claimed in claim 1, wherein the device is configured as a synchronous DRAM in which each of the data transfer commands is a data read command, the data transfer operation responsive to the data read command comprising reading out data from an inside of the synchronous DRAM to an outside of the synchronous DRAM, and the transfer completion signal comprising a burst end signal indicative of a completion of a burst transfer of data signals read out from the inside of the synchronous DRAM to the outside of the synchronous DRAM.

12. The device as claimed in claim 11, wherein the synchronous DRAM accepts a power-down command and further comprises a power-down control circuit that responds to the power-down command and the active level of the second logic circuit to cause the synchronous DRAM to enter into a power-down mode.

13. A device that can perform a data transfer operation in response to each of data transfer commands and can accept a new data transfer command while a data transfer operation responsive to a current data transfer command is in progress, comprising:

a plurality of latch circuits each including a clock terminal, an input terminal and an output terminal, the latch circuits being connected in cascade such that the output terminal of a preceding one of the latch circuits is connected to the input terminal of a succeeding one of the latch circuits;

a clock node supplied with a clock signal controlling the data transfer operation, the clock node being connected in common to the clock terminals of the latch circuits;

an input node supplied with a transfer initiation signal that takes an active level each time the data transfer operation responsive to each data transfer command is initiated, the input node being connected to the input terminal of a leading one of the latch circuits; and a logic circuit coupled to the output terminals of the latch circuits, the logic circuit producing a first output signal when at least one of the latch circuits produces at the output terminal thereof a first logic level responsive to the active level of the transfer initiation signal and a second output signal when none of the latch circuits produces at the output terminal thereof the first logic level, wherein the data transfer operation is completed in a plurality of cycles of the clock signal that is responsive to an addition latency (AL), a CAS latency (CL) and a burst length (BL).

14. The device as claimed in claim 13, wherein the number of the latch circuits is equal to the cycles of the clock signal that complete the data transfer operation.

15. The device as claimed in claim 13, wherein the logic circuit comprises an NOR gate circuit.

16. The device as claimed in claim 13, wherein the device is configured as a synchronous DRAM in which each of the data transfer commands is a data read command, and the data transfer operation responsive to the data read command comprising reading out data from an inside of the synchronous DRAM to an outside of the synchronous DRAM.

17. A device that can perform a data transfer operation in response to each of data transfer commands and can accept a new data transfer command while a data transfer operation responsive to a current data transfer command is in progress, comprising;

a plurality of latch circuits each including a clock terminal, an input terminal and an output terminal, the latch circuits being connected in cascade such that the output terminal of a preceding one of the latch circuits is connected to the input terminal of a succeeding one of the latch circuits;

a clock node supplied with a clock signal controlling the data transfer operation, the clock node being connected in common to the clock terminals of the latch circuits;

an input node supplied with a transfer initiation signal that takes an active level each time the data transfer operation responsive to each data transfer command is initiated, the input node being connected to the input terminal of a leading one of the latch circuits; and a logic circuit coupled to the output terminals of the latch circuits, the logic circuit producing a first output signal when at least one of the latch circuits produces at the output terminal thereof a first logic level responsive to the active level of the transfer initiation signal and a second output signal when none of the latch circuits produces at the output terminal thereof the first logic level;

wherein the device accepts a power-down command and further comprises a power-down control circuit that responds to the power-down command and the second output signal of the logic circuit to cause the device to enter into a power-down mode.

18. The device as claimed in claim 17, wherein the data transfer operation is completed in a plurality of cycles of the clock signal, and the number of the latch circuits is equal to the cycles of the clock signal that complete the data transfer operation.

19. The device as claimed in claim 18, wherein the cycles of the clock signal that complete the data transfer operation is responsive to an addition latency (AL), a CAS latency (CL) and a burst length (BL).

\* \* \* \* \*